(12) United States Patent
Huang et al.

(10) Patent No.: US 12,276,906 B2
(45) Date of Patent: Apr. 15, 2025

(54) METHODS FOR CLEANING LITHOGRAPHY MASK

(71) Applicant: Taiwan Semiconductor Manufacturing Company, LTD., Hsinchu (TW)

(72) Inventors: I-Hsiung Huang, Hsinchu County (TW); Yung-Cheng Chen, Jhubei (TW); Chi-Lun Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 514 days.

(21) Appl. No.: 17/690,150

(22) Filed: Mar. 9, 2022

(65) Prior Publication Data

US 2023/0152686 A1 May 18, 2023

Related U.S. Application Data

(60) Provisional application No. 63/279,835, filed on Nov. 16, 2021.

(51) Int. Cl.
| | |
|---|---|
| G03F 1/82 | (2012.01) |
| G03F 1/22 | (2012.01) |
| G03F 1/26 | (2012.01) |
| G03F 1/62 | (2012.01) |

(52) U.S. Cl.
CPC .................. *G03F 1/82* (2013.01); *G03F 1/22* (2013.01); *G03F 1/26* (2013.01); *G03F 1/62* (2013.01)

(58) Field of Classification Search
CPC ........................................................ G03F 1/82
USPC .............................................................. 430/5
See application file for complete search history.

(56) References Cited

U.S. PATENT DOCUMENTS

| | | | | |
|---|---|---|---|---|
| 8,182,609 | B1* | 5/2012 | Le Claire | G03F 1/82 |
| | | | | 134/1 |
| 8,562,749 | B2* | 10/2013 | LeClaire | H01L 21/67028 |
| | | | | 134/1 |
| 10,078,260 | B2* | 9/2018 | Inazuki | G03F 1/82 |
| 10,545,401 | B2* | 1/2020 | Inazuki | G03F 1/26 |
| 11,311,917 | B2* | 4/2022 | LeClaire | G03F 1/82 |

* cited by examiner

*Primary Examiner* — Christopher G Young
(74) *Attorney, Agent, or Firm* — Lippes Mathias LLP

(57) ABSTRACT

Methods for removing haze defects from a photomask or reticle are disclosed. The photomask is placed into a chamber which includes a hydrogen atmosphere. The photomask is then exposed to radiation. The energy from the radiation, together with the hydrogen, causes decomposition of the haze defects. The methods can be practiced on-site and quickly, without the need for wet chemicals or the need to remove the pellicle before cleaning of the photomask. A device for conducting the methods is also disclosed herein.

20 Claims, 7 Drawing Sheets

METHODS FOR CLEANING LITHOGRAPHY MASK

PRIORITY CLAIM AND CROSS-REFERENCE

This application claims priority to U.S. Provisional Patent Application Ser. No. 63/279,835, filed on Nov. 16, 2021, which is incorporated by reference in its entirety.

BACKGROUND

Photolithographic patterning processes use a reticle (i.e. photomask) that includes a desired mask pattern. Ultraviolet light is used to transfer the pattern to a photoresist on a semiconductor wafer, and the desired pattern is used to produce a layer on the wafer substrate. Defects on the reticle can impact the transferred pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
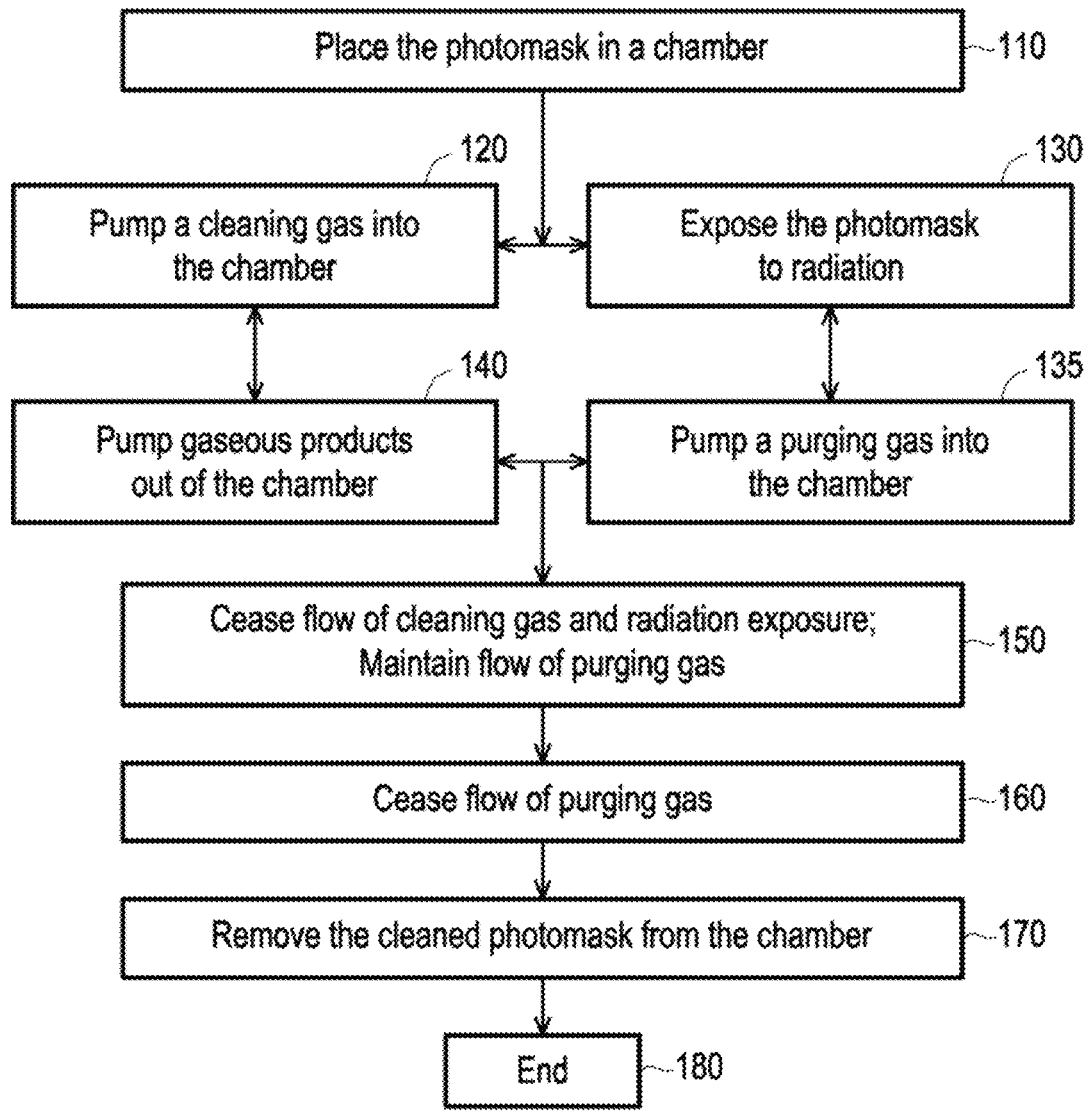
FIG. 1 is a flowchart illustrating some methods of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement techniques for determining the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to haze defects which can arise in photomasks used for photolithographic processes. In this regard, mask haze can result from oxidation reactions which occur with materials introduced during reticle manufacturing, handling, or photolithography processes. For example, chemical residues from mask making and/or cleaning processes can include $C_xH_yO_z$, ammonia ($NH_3$), amines, $SO_x$, $H_2O$, and $C_xH_y$ and others which can cause haze. These residues can arise from the use of chemicals such as sulfuric acid ($H2SO_4$) and hydrogen peroxide ($H_2O_2$). These chemicals can react with different layers of the reticle and the pellicle, for example layers such as $MoSi_2$ and/or $MoO_x$ and/or Ru. Those reactions can also be further catalyzed due to energy provided by radiation exposure. Over time, the surface of the photomask and/or pellicle can oxidize.

Haze defects arising from crystallization of various materials can then occur around the patterned image on the photomask. Haze may alter the transmission properties of the photomask, causing printing errors on the semiconducting wafer substrate. Defects can thus be introduced in the resulting integrated circuit, such as short circuits or unconnected elements. For example, the critical dimension (CD) of the photomask can change as water and hydrocarbons react with the mask material. The operating lifetime of a given photomask can be shortened by such haze defects, and overall productivity of the photolithography process can also be affected.

Thus, the methods of the present disclosure relate to treating a photomask/reticle for photolithography so as to remove haze defects. Very generally, the photomask is placed in a sealable chamber. A cleaning gas is pumped into the chamber, the cleaning gas comprising hydrogen ($H_2$). The photomask is then exposed to radiation, which provides energy for chemical reactions to occur. The haze defects present on the photomask decompose into gaseous molecules which can then be pumped out of the chamber.

These methods can be considered as reversing the oxidation reactions that originally created the haze defects. These methods of the present disclosure clean the photomask (and the pellicle) in a more convenient and efficient manner. These methods can also be practiced on-site. Removal of haze defects also improves the critical dimension uniformity (CDU) of the photomask. Thus, good quality and accurate critical dimension performance can be obtained from the photomask.

Of particular significance, these methods can be used without the need to remove a pellicle from the photomask. The pellicle is typically mounted a short distance above the photomask and used to keep any contaminant particles which might fall onto the photomask out of the focal plane of the photomask, thus reducing or preventing defects in the transferred pattern caused by the contaminating particles. The elimination of the need to remove the pellicle prior to cleaning decreases overall cleaning time, which can improve overall productivity.

The methods of the present disclosure are contemplated to be applicable to photomasks used in any photolithographic process for the production of integrated circuits. For example, the present methods and systems can be used for cleaning photomasks used in g-line lithography (436 nm), h-line lithography (405 nm), i-line lithography (365 nm), or DUV processes using KrF (248 nm) or ArF (193 nm) lasers and immersion lithography. They are also believed to be useful with photomasks used in extreme ultraviolet (EUV) processes, which span wavelengths from 124 nanometers (nm) down to 10 nm.

The photomask can be any kind of photomask, for example a phase shift mask (PSM), a super binary mask (SBIM), a reflective mask, a transmissive mask, and/or combinations thereof. In an alternating phase shift mask, light-transmitting regions are made thinner or thicker in specific locations to induce a phase shift in the transmitted light, which has the effect of increasing image resolution. In an attenuating phase shift mask, light-blocking regions are made thinner or thicker in specific locations to permit some light transmission, which can interfere with the light coming from light-transmitting regions to again increase image resolution. A binary mask includes a blank upon which a patterned layer of material is deposited. In a reflective mask, light is reflected off the front surface of the photomask containing the mask pattern. In a transmissive mask, light passes through the rear surface of the photomask and then blocked by opaque material to obtain the mask pattern. The resolution of the mask pattern can increase as the wavelength of the light decreases. Generally, any mask having a critical dimension of about 180 nm or lower can be cleaned using the methods of the present disclosure.

The photomask may or may not include a pellicle. However, one advantage of the cleaning methods of the present disclosure is that they can be used without requiring the removal or de-mounting of the pellicle, as is typically required in current processes. This saves considerable time by avoiding additional inspection/certification steps as well as avoiding the possibility of physically damaging the photomask during the handling of the pellicle. Thus, in particular embodiments, the methods are performed on a photomask that includes a pellicle.

FIG. 1 is a flowchart illustrating the methods of the present disclosure. In step 110, the patterned photomask is placed in a sealable or airtight chamber. In some particular embodiments, a pellicle is mounted above the photomask. In step 120, a cleaning gas is pumped into the chamber. For example, the cleaning gas may comprise hydrogen ($H_2$). In step 130, the photomask is exposed to radiation. The concurrent presence of the cleaning gas with the radiation causes haze defects present on the photomask to decompose into gaseous molecules. It is noted that the environment within the chamber can be pumped out and replaced entirely with the cleaning gas before radiation exposure, if desired. In step 140, the gaseous byproducts are pumped out of the chamber. In some embodiments indicated in step 135, a purging gas is also introduced into the chamber. An example of such a purging gas is nitrogen ($N_2$), helium ($He_2$), argon, or other inert gas. Steps 120, 130, and 140 are generally performed concurrently, and step 135 can also be performed concurrently with these three steps. This cleaning process continues for a predetermined time period, or until monitoring of the gases exiting the chamber indicate no further gaseous byproducts indicative of haze removal are being produced. Next, in step 150, the flow of the cleaning gas and the radiation are turned off or ceased. The flow of the purging gas continues to be maintained and gases continue to be pumped out of the chamber. Next, in step 160, the flow of the purging gas is turned off or ceased. In step 170, the cleaned photomask is removed from the chamber. The method then ends, as indicated at step 180.

In this regard, without being limited by theory, it is believed that haze defects can be removed due to the following chemical reaction:

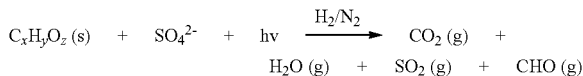

As expressed in this equation, solid defects on the photomask containing carbon, hydrogen, and oxygen, as well as defects containing sulfur can be converted into gaseous byproducts such as carbon dioxide, water, sulfur dioxide, and aldehydes. When the reaction equilibrium is driven to the right-hand side, the haze defects provide reactant material. The resulting gaseous byproducts are separated and removed from the photomask.

With respect to step 130, the photomask is exposed to radiation having one or more wavelengths of about 0.1 nanometers (nm) to about 193 nm, in accordance with some embodiments. This range includes "soft" X-rays having a wavelength of about 0.2 nm to about 10 nm; and ultraviolet (UV) radiation having a wavelength of from about 10 nm to about 193 nm. These wavelengths provide sufficient energy for the decomposition reactions to occur in a short time period (i.e. shorter wavelengths have more energy). In particular embodiments, the time period for the radiation exposure can be about 15 minutes or less, including from about 10 minutes to about 15 minutes. The radiation can be produced using, for example, noble gas or noble gas hydride compound lamps, or light-emitting diodes (LEDs).

The radiation exposure can occur while the atmosphere inside the chamber is at any pressure, including atmospheric pressure. However, in particular embodiments, the chamber is operated at a pressure of about 3000 pascals (Pa) or less. In other particular embodiments, the chamber is operated at a pressure of about 3000 Pa to about $10^{-4}$ Pa, or from about $10^{-4}$ Pa to about $10^{-7}$ Pa. In this regard, the lower pressure decreases the amount of radiation energy absorbed by the ambient environment within the chamber, increasing the amount of energy available for decomposition of the defects that cause haze in the photomask. The operating pressure of the chamber can vary depending on the wavelength of the radiation used for exposure, with longer wavelengths permitting a lower operating pressure.

With respect to steps 120 and 145, the ratio of the cleaning gas (e.g. $H_2$) to the purging gas (e.g. $N_2$) may also vary depending on the operating pressure of the chamber. It is contemplated that the cleaning gas and the purging gas will be present in the chamber at the same time during irradiation. Very generally, the ratio of the cleaning gas to the purging gas (v/v) can range from about 100:0 to about 1:99. When the operating pressure of the chamber is atmospheric pressure (i.e. about 101 kPa), the ratio should be from about 4:96 to about 1:99. When the operating pressure of the chamber is less than 1 kPa, the ratio should from about 100:0 to about 90:10.

Figure 2A:
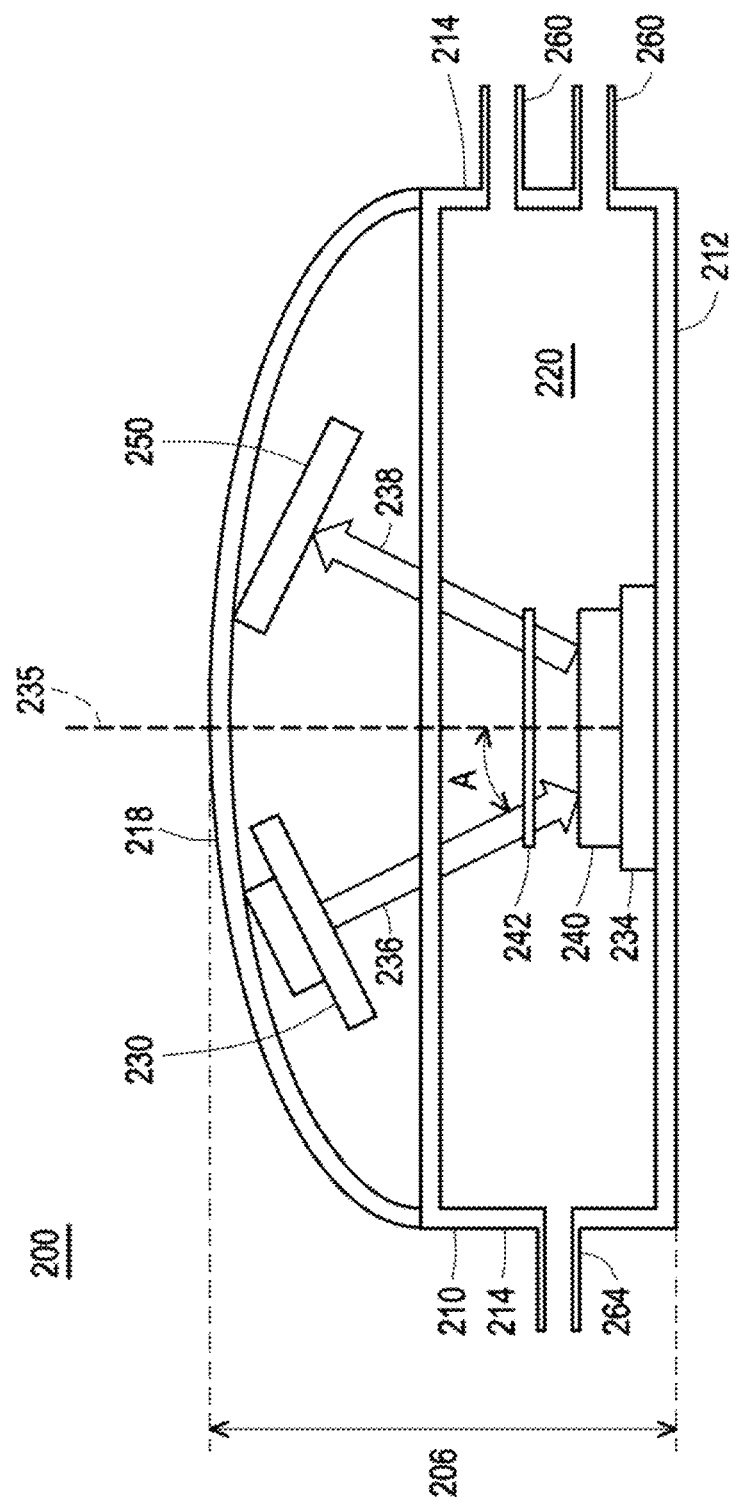
FIG. 2A is a cross-sectional view of an example cleaning device for practicing the methods of the present disclosure, in accordance with some embodiments.
Figure 2B:
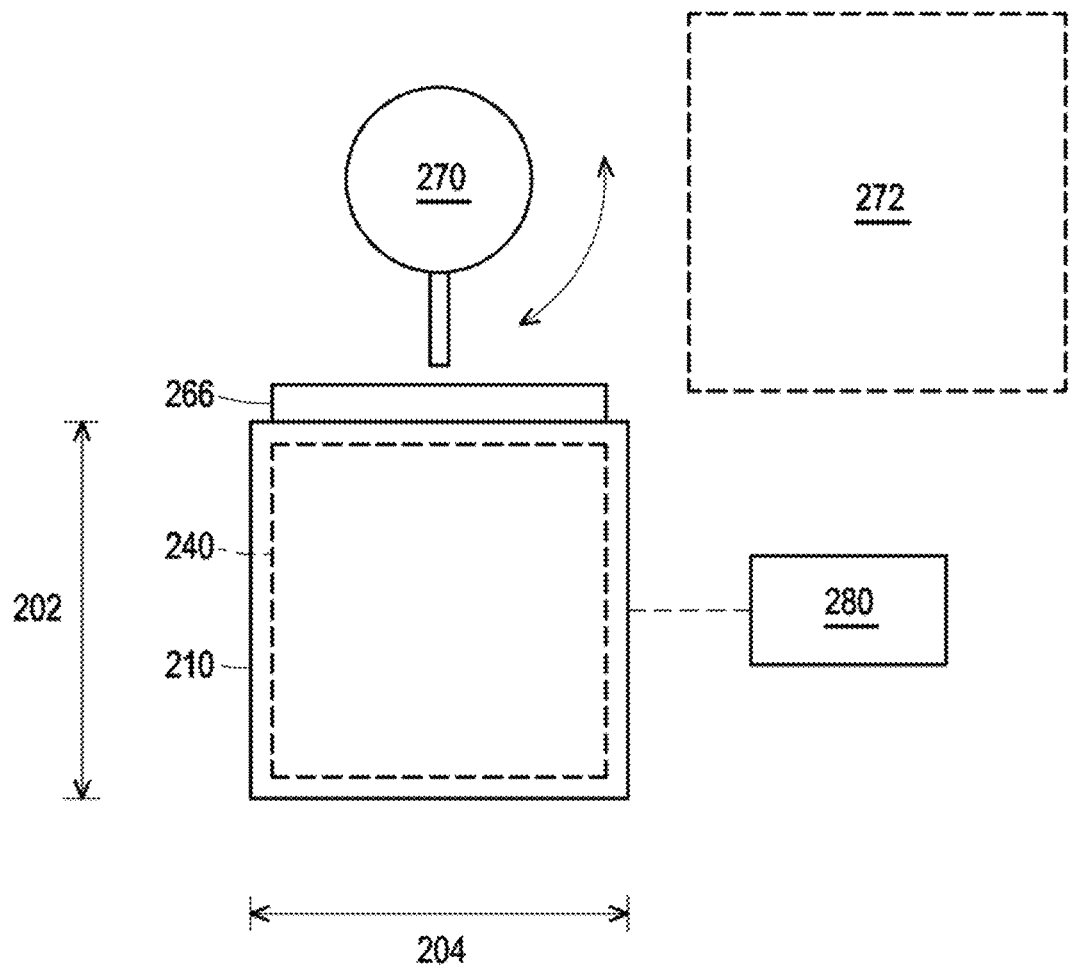
FIG. 2B is a plan view of the example cleaning device of FIG. 2A.

FIG. 2A is a side cross-sectional schematic diagram of a cleaning device for practicing the methods of FIG. 1, and FIG. 2B is a plan view of the cleaning device, according to some embodiments. Not all components are shown in both figures. Referring to both figures, the cleaning device 200 includes a cleaning chamber 210. The chamber 210 includes a bottom wall 212, side walls 214, and a top wall 218 which enclose an internal volume 220. At least one light source 230 is located at a top of the chamber, and is shown here attached to the top wall. The bottom wall 212 includes a platform or stage 234 upon which the photomask 240 is placed. The photomask 240 is placed with the pellicle 242 facing the light source 230, or put another way so that the pellicle 242 is between the light source 230 and the photomask 240 itself.

The light source 230 is located along the top wall such that relative to a vertical axis 235 passing through the center of the photomask, the light (i.e. radiation) from the light source (reference numeral 236) has a downward angle A of about 35 degrees or less. This is so the light/radiation can directly illuminate the entirety of the photomask, which makes it easier to control the intensity of the photomask exposure. This also avoids the possibility of the pellicle frame casting shadows upon the photomask. In operation, the light/radiation will pass through the pellicle to illuminate the photomask and any haze defects thereon. It is noted that while the light source is illustrated here as a singular light source, the cleaning device may have multiple light sources. For example, the device could include four light sources arranged in a 2×2 array. In such embodiments having multiple light sources, the light sources may emit radiation at the same wavelength or at different wavelengths. This might be useful, for example, in situations where different wavelengths are selectively absorbed by different solid compounds in the haze defects. The intensity and total dose of energy received does not have to be uniform over the photomask, although uniformity might be desirable.

The platform or stage 234 is located relative to the light source(s) 230 so that a photomask on the platform/stage is illuminated therefrom. Depending on the construction of the cleaning device, the platform/stage may be located in the center thereof, or can be located to one side. The stage can use mechanical, vacuum, electrostatic or other clamping techniques to hold the photomask in place. In some embodiments, the stage itself may be fixed in place, or may be removable or separable from the cleaning device and the chamber.

A protective sheet 250 is located complementarily to the light source, or in other words at a location reflected about the vertical axis 235 so as to absorb the radiation reflected by the photomask. This location is generally symmetrical to the location of the light source, with the center of the protective sheet being located +/−30% of this location. As a result, the light 236 reflecting off the photomask 240 is transmitted (reference numeral 238) towards the protective sheet. When multiple light sources are present, a protective sheet should be located at each reflective location. It is also contemplated that protective sheeting could be placed over the majority of the top wall of the cleaning device, simplifying the manufacture of the cleaning chamber.

The protective sheet may be made from a material including lead (Pb), tin (Sn), antimony (Sb), tungsten (W) bismuth (Bi), or other elements. In particular, lead composites, which are a mixture of lead and other lighter weight metals, are contemplated for the protective sheet. Such lead-based composite blends may include a mixture of lead, tin, rubber, PVC, vinyl, and other proprietary attenuating metals. These lead-based composite blends may be up to 25% lighter than regular grade lead while providing the same protection level as lead.

Continuing, the chamber can include one or more gas inlets 260 for the cleaning gas and the purging gas. The gas inlets are connected to gas sources for providing the specified gas. A vacuum outlet 264 is also present, for removing gaseous byproducts from the chamber and for changing the environment within the chamber from ambient to the cleaning gas. The vacuum outlet is connected to a pump for creating the vacuum. The inlets and outlets are typically located on different walls of the chamber. In this regard, as will be described later, the pellicle frame typically includes vent holes, and the pellicle itself may be porous. The cleaning gas and the purging gas are able to pass through these holes/pores to reach the surface of the photomask to perform their respective functions.

The chamber also includes a door 266 for accessing the internal volume, to insert and remove the photomask and pellicle. The chamber can be sealed to maintain its internal environment separate from that of the external ambient environment.

The chamber is sized to fit the photomask and pellicle. In some particular embodiments, the chamber has a length 202 and a width 204 of about 1 meter (100 cm), and the chamber has a height 206 of about 50 cm to about 60 cm. For reference, a photomask or reticle typically has a maximum length and width of about 82 cm, and a thickness of less than 10 millimeters. A pellicle is typically mounted on a pellicle frame and located about 5 mm to about 10 mm above the photomask.

The cleaning device/chamber can be made as desired from suitable materials, such as plastics and/or metals. The various components and their shapes and sizes can be made using suitable manufacturing techniques.

In some embodiments, the photomask and pellicle can be manually inserted and removed from the chamber. In other embodiments as illustrated in FIG. 2B, an automated handling system 270 may be configured to transfer the photomask 240 and pellicle 242 from the cleaning chamber 210 to a second different position 272. For example, a robot could be used to transport the photomask and pellicle between the cleaning chamber and a reticle SMIF (Standard Mechanical InterFace) pod or a FOUP (Front Opening Unified Pod) which is used to protect the photomask during storage and transport. The cleaning device and chamber are contemplated to be used off-line, or in other words as a separate device from the photolithographic tool line that produces integrated circuits. However, it is possible for the cleaning chamber to be directly integrated with a photolithographic tool, such as an EUV lithography machine, if desired. The automated handling system may be integrated into the overall cleaning device, or may be provided as a separate component, for example as part of an equipment front end module (EFEM).

The cleaning device of FIG. 2B can may include one or more general purpose computers, special purpose computer(s), a programmed microprocessor or microcontroller and peripheral integrated circuit elements, an ASIC or other integrated circuit, a digital signal processor, a hard-wired electronic or logic circuit such as a discrete element circuit, a programmable logic device such as a PLD, PLA, FPGA, Graphical card CPU (GPU), or PAL, or the like (as represented by reference number 280). In general, any device, capable of implementing a finite state machine that is in turn capable of implementing the functions and structures described above (and/or embodied in the flowchart shown in FIG. 1) can be used to implement the methods for removing haze defects from the photomask and pellicle.

In addition, the cleaning device may include sensors for monitoring applicable parameters. For example, such sensors may include those for determining the location of the photomask and pellicle, for tracking the flow rate of the cleaning gas and/or purging gas, for measuring the content of gases exiting the chamber, for measuring the pressure within the cleaning chamber, etc. The controller can also determine whether to activate or deactivate the light source, and potentially also control the motion of the automated handling system (if present). It is noted that these various parameters do not have to be held steady during the cleaning methods, and could be changed by the controller operating a computer program which alters their setpoints as appropriate. The controller may also include a user interface for communicating with operators.

Figure 3:
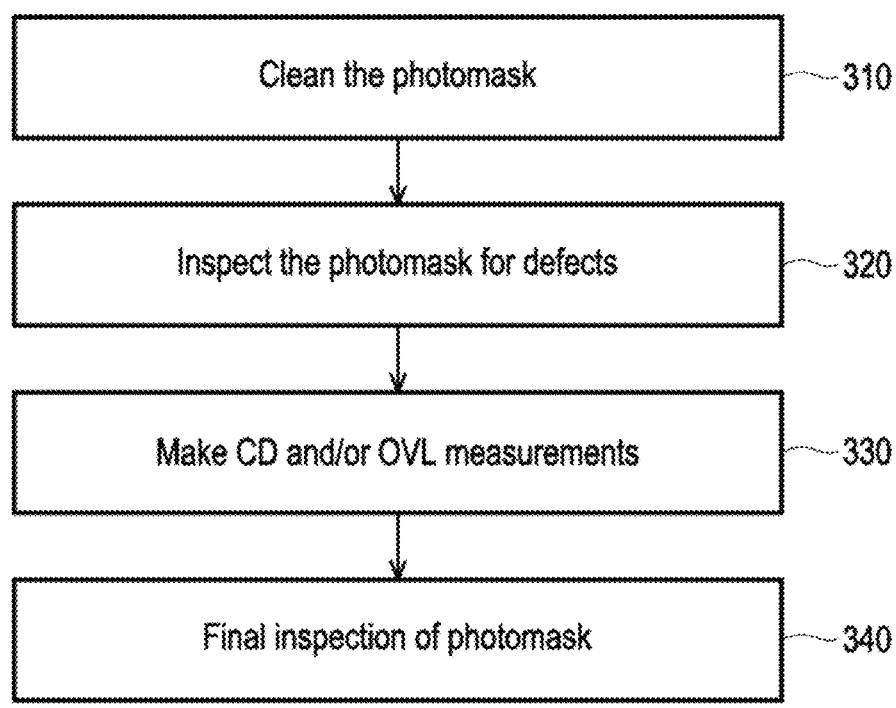
FIG. 3 is a flowchart showing a method for cleaning and certifying a photomask, in accordance with some embodiments.

FIG. 3 is a flowchart illustrating an overall method for cleaning and certifying a photomask, according to some embodiments. Four steps are contemplated by the present disclosure. In step 310, the photomask is cleaned using the photochemical cleaning methods described above in FIG. 1, to remove haze defects. In step 320, the photomask is then inspected for any further defects. In step 330, critical dimension (CD) and/or overlay control (OVL) measurements are made. These measurements are used for controlling and aligning the patterns of the multiple photomasks that are used to produce a complete integrated circuit, and are useful in determining the error budget and meeting total measurement uncertainty requirements for the overall production process. In step 340, final inspection of the photomask is performed to certify that the photomask is ready for use. These measurement and inspection steps can be performed at separate stations, or the cleaning device/chamber may be part of a larger machine that integrates all of these functions together.

Figure 4:
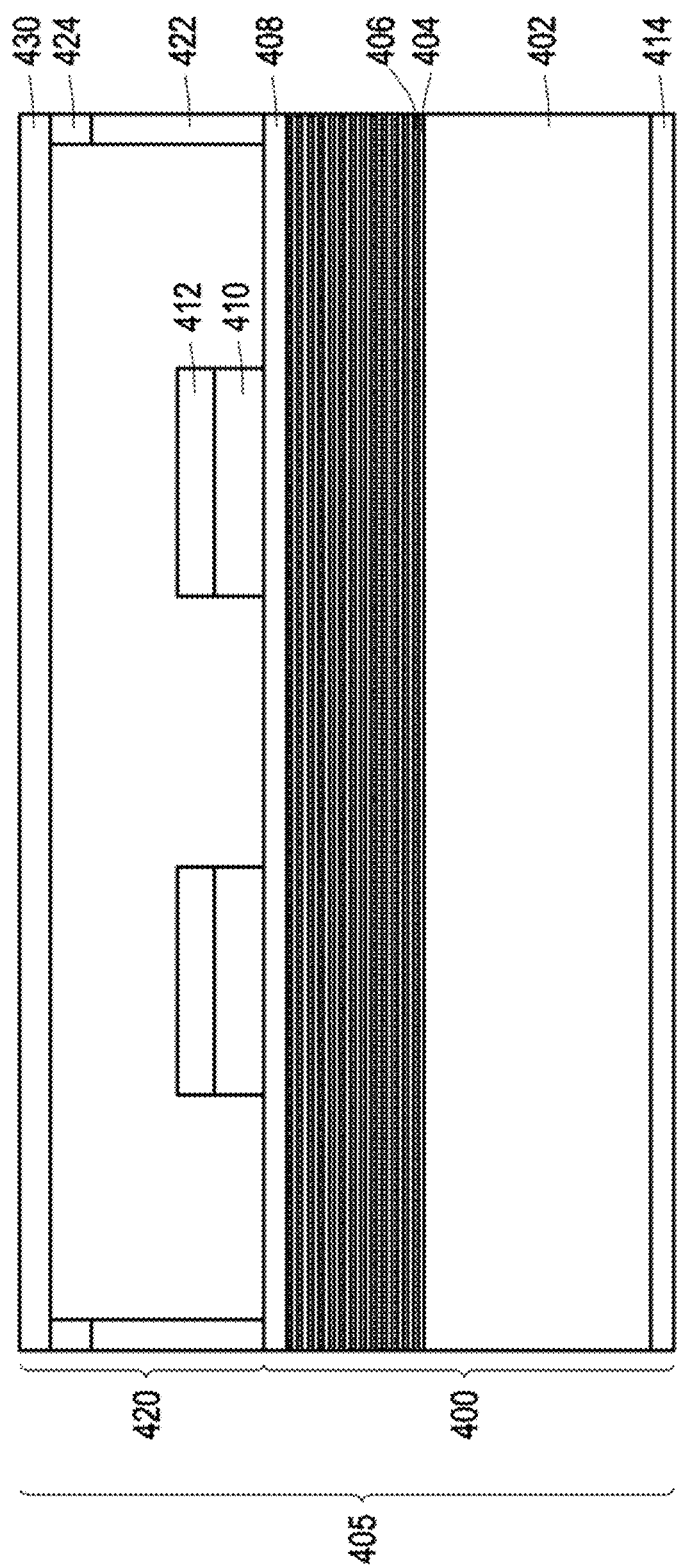
FIG. 4 is a cross-sectional view of a first example mask and pellicle assembly upon which the methods of the present disclosure can be used, in accordance with some embodiments.

FIG. 4 illustrates a cross-sectional view of one embodiment of a photomask reticle assembly 405 useful in EUV lithography, which is intended to be a non-limiting example according to some embodiments of a photomask that can be cleaned using the methods of the present disclosure. The assembly 405 includes a photomask/reticle 400 and a pellicle assembly 420. The illustrative reticle 400 (also referred to in the art as a mask, photomask, or similar phraseology) includes a substrate 402, alternating reflective layers 404 and spacing layers 406, a capping layer 408, an EUV absorbing layer 410 that is patterned to define a mask pattern, an anti-reflective coating (ARC) 412, and a conductive backside layer 414. The pellicle assembly 420 includes a mounting frame 422, an adhesive layer 424, and a pellicle membrane 430.

In embodiments, the substrate 402 is made from a low thermal expansion material (LTEM), such as quartz or titania silicate glasses available from Corning under the trademark ULE. This reduces or prevents warping of the reticle due to absorption of energy and consequent heating. The reflective layers 404 and the spacing layers 406 cooperate to form a Bragg reflector for reflecting EUV light. In some embodiments, the reflective layers may comprise molybdenum (Mo). In some embodiments, the spacing layers may comprise silicon (Si). The capping layer 408 is used to protect the reflector formed from the reflective layers and the spacing layers, for example from oxidation. In some embodiments, the capping layer comprises ruthenium (Ru). The EUV absorbing layer 410 absorbs EUV wavelengths, and is patterned with the desired pattern. In some embodiments, the EUV absorbing layer comprises tantalum boron nitride. The anti-reflective coating (ARC) 412 further reduces reflection from the EUV absorbing layer. In some embodiments, the anti-reflective coating comprises oxidized tantalum boron nitride. The conductive backside layer 414 permits mounting of the illustrative reticle on an electrostatic chuck and temperature regulation of the mounted substrate 402. In some embodiments, the conductive backside layer comprises chrome nitride.

The mounting frame 422 supports the pellicle membrane at a height sufficient to take the pellicle membrane 430 outside of the focal plane of the lithography, e.g. several millimeters (mm) over the reticle in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 424 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

The pellicle membrane 430 is usually stretched over the mounting frame to obtain a uniform and flat surface. However, sagging of the pellicle membrane can occur, causing the membrane to deflect significantly from the desired flat and uniform orientation. This deflection can affect the light that is being reflected from the reticle and the resulting transferred pattern. Examples of suitable materials for the pellicle membrane include ruthenium (Ru), porous silicon (pSi), SiN, SiC, MoSi, or $MoSi_xN_y$. The pellicle membrane may be a single layer, or can be a multi-layer structure.

Figure 5:
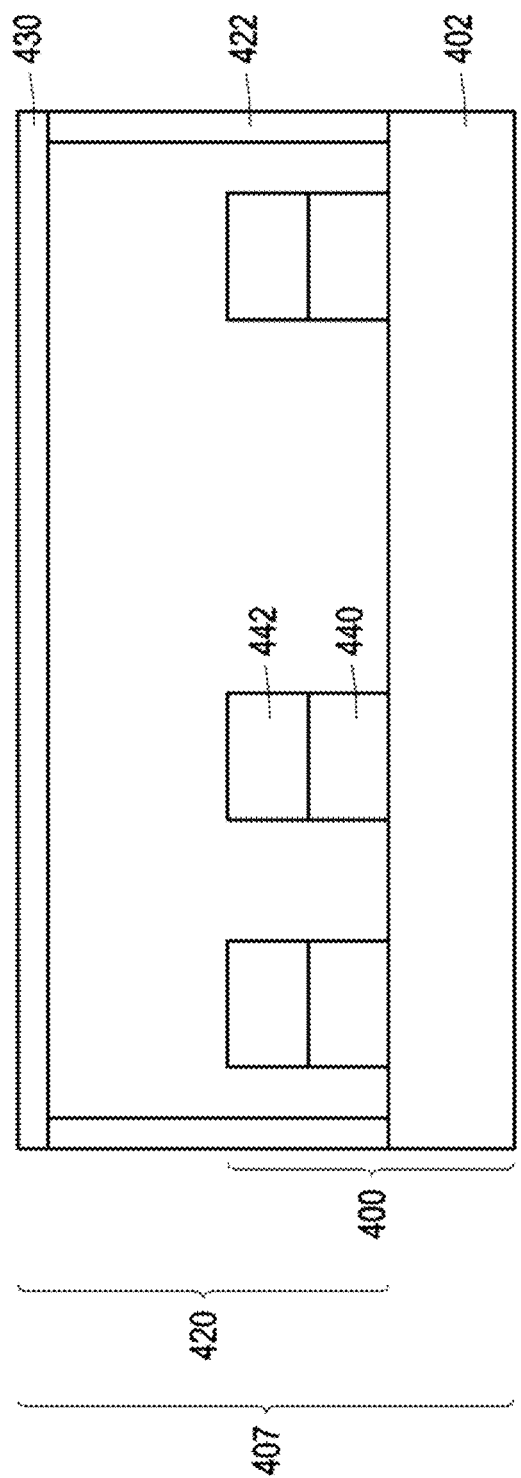
FIG. 5 is a cross-sectional view of a second example photomask and pellicle assembly upon which the methods of the present disclosure can be used, in accordance with some embodiments.

FIG. 5 illustrates a cross-sectional view of another embodiment of a photomask/reticle assembly 407 which may be useful in ArF lithography. The assembly 407 includes a photomask/reticle 400 and a pellicle assembly 420. The illustrative reticle 400 here is a phase shift mask that includes a substrate 402, a phase shift layer 440, and an absorber layer 442. The phase shift layer 440 is made of a material (usually MoSi) that allows a small percentage of light to pass through. The thickness of the phase shift layer is selected so that the light that does pass through is 180° out of phase with the light passing through the substrate 402. The absorber layer is commonly made of chromium (Cr), aluminum (Al), iron oxide (FeO), titanium (Ti), or a silver-halide emulsion.

One advantage to the methods of the present disclosure is that the use of radiation for cleaning completely removes the need to use wet solvents and other liquids. This, in turn, eliminates the need for equipment and time needed to ensure the safe use of such liquids, and to ensure those liquids have been completely removed and the photomask is completely dry. This also simplifies logistics and supplies, as such solvents and liquids do not need to be provided and thus their lack cannot cause downtime.

Another advantage to the methods of the present disclosure is that they can be performed on-site or in-house. This permits turnaround in a relatively quick time period of about 10 minutes to about 15 minutes. This is because, among other things, the need to remove the pellicle is eliminated. Current mask cleaning methods require time-consuming steps such as sending the mask off-site, the pellicle to be de-mounted, cleaning using treatments such as UV/ozone or sulfur peroxide mix (SPM) or the RCA clean, critical dimension measurement, pellicle re-mounting, and inspection, which together can take several days.

These methods can also used off-line with a given photomask, permitting the overall manufacturing process to continue with other photomasks. This lowers the overall cost and also increases efficiency of the overall manufacturing process.

Some embodiments of the present disclosure thus relate to methods for removing haze defects from a patterned photomask used in the production of integrated circuits. The photomask is placed into a chamber. A cleaning gas comprising hydrogen ($H_2$) and a purging gas comprising nitrogen ($N_2$) are pumped into/through the chamber. The photomask is concurrently exposed to radiation having a wavelength of about 0.1 nm to about 193 nm to decompose the haze defects. After the haze defects are removed, the pumping of the cleaning gas and the exposure to radiation are ceased, while maintaining pumping of the purging gas, to remove final byproducts and cleaning gas from the chamber. The pumping of the purging gas is then ceased, and the patterned photomask can be removed from the chamber.

Other embodiments of the present disclosure relate to further methods for removing haze defects from a photomask. An assembly comprising the photomask and a pellicle mounted above the photomask is received. The photomask is exposed to radiation to decompose the haze defects into gaseous compounds, which are then removed from the photomask. In particular, the pellicle does not need to be removed before the photomask is exposed to the radiation.

The present disclosure also relates to devices/machines for cleaning a photomask. The device includes a chamber having a platform upon which a photomask will be placed. At least one light source is located at a top of the chamber with a downward angle of about 35° or less, relative to the platform. A protective sheet is located complementarily to the at least one light source. The chamber has a vacuum outlet and a gas inlet.

The present disclosure is further illustrated in the following non-limiting working example, it being understood that this example is intended to be illustrative only and that the disclosure is not intended to be limited to the materials, conditions, process parameters and the like recited herein.

EXAMPLE

Figure 6:
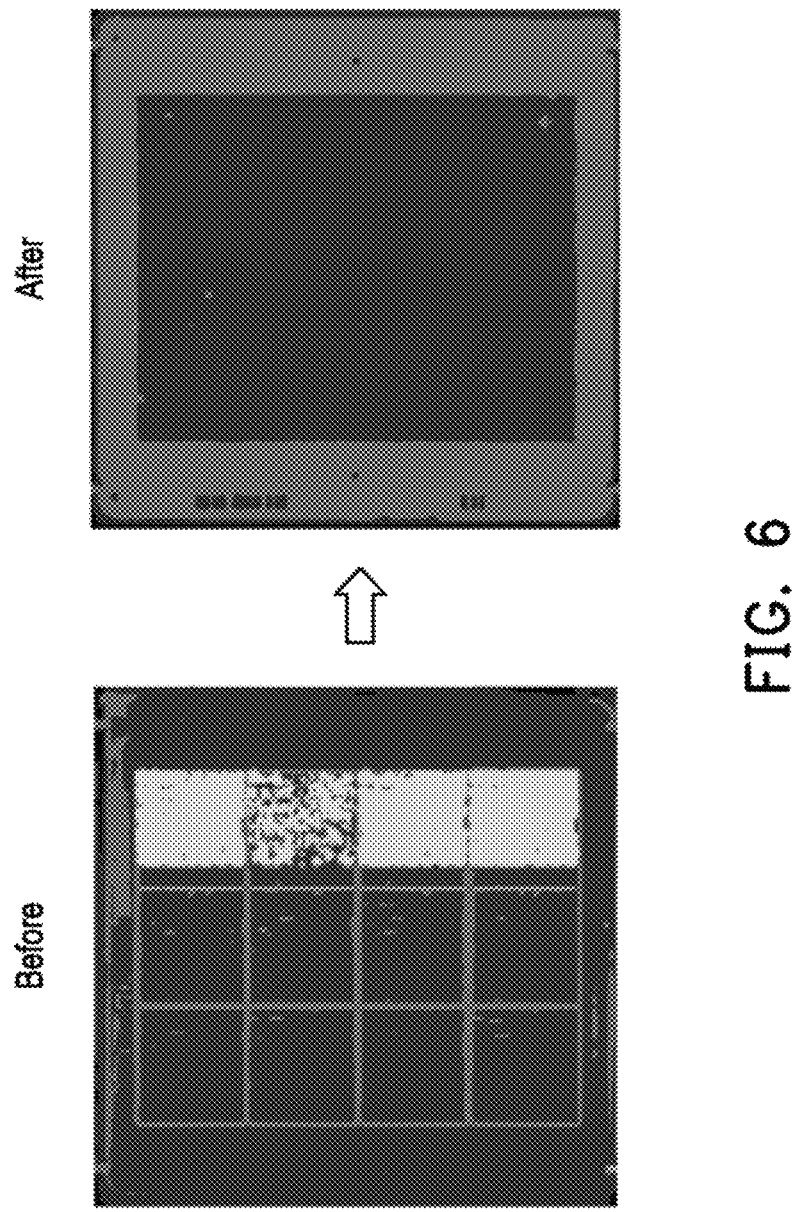
FIG. 6 is a set of "before" and "after" images from an experiment practicing an embodiment of a method of the present disclosure.

A photomask and pellicle having haze defects were exposed to soft x-rays having a wavelength of 193 nm. The distance between the photomask/pellicle and the x-ray was approximately 5 cm. FIG. 6 shows two pictures before and after the x-ray exposure. In the "before" picture on the left, the haze defects are present on the right-hand side of the photomask. In the "after" picture on the right, those defects are now absent. The soft x-rays successfully passed through the pellicle and removed the haze defects on the photomask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing haze defects from a patterned photomask used in the production of integrated circuits, comprising:
   placing the patterned photomask into a chamber;
   pumping a cleaning gas and a purging gas into the chamber, the cleaning gas comprising hydrogen and the purging gas comprising nitrogen;
   exposing the patterned photomask to radiation having a wavelength of about 0.1 nm to about 193 nm to decompose the haze defects;
   ceasing the pumping of the cleaning gas and the exposure to radiation while maintaining pumping of the purging gas;
   ceasing the pumping of the purging gas; and
   removing the patterned photomask from the chamber.

2. The method of claim 1, wherein the ratio of hydrogen to nitrogen is from about 100:0 to about 1:99.

3. The method of claim 1, wherein the photomask includes a pellicle.

4. The method of claim 1, wherein the radiation is provided by a light source located at a top of the chamber with a downward angle of about 35° or less.

5. The method of claim 4, wherein the chamber further comprises a protective sheet located complementarily to the light source.

6. The method of claim 1, wherein the chamber is operated at a pressure of about 3000 Pa or less.

7. The method of claim 1, wherein the photomask is exposed to radiation for a time period of about 10 minutes to about 15 minutes.

8. The method of claim 1, wherein the photomask is a phase shift mask (PSM), a super binary mask (SBIM), a reflective mask, a transmissive mask, or a combination thereof.

9. A repurposed photomask produced by the method of claim 1.

10. A method for removing haze defects from a photomask, comprising:
    receiving an assembly comprising the photomask and a pellicle mounted above the photomask, the photomask having haze defects; and
    exposing the photomask to radiation to decompose the haze defects into gaseous compounds which are then removed from the photomask;
    wherein the pellicle is not removed for the exposure to radiation.

11. The method of claim 10, wherein the radiation has a wavelength of about 0.1 nm to about 193 nm.

12. The method of claim 10, wherein the gaseous compounds include carbon dioxide, water, and aldehydes.

13. The method of claim 10, wherein the exposure to radiation occurs in an $H_2/N_2$ environment within a chamber.

14. The method of claim 13, wherein the ratio of $H_2$ to $N_2$ is from about 100:0 to about 4:96.

15. The method of claim 13, wherein the radiation is provided by a light source located at a top of the chamber with a downward angle of about 35° or less.

16. The method of claim 13, wherein the chamber is operated at a pressure of about 3000 Pa or less.

17. The method of claim 10, wherein the photomask is exposed to radiation for a time period of about 10 minutes to about 15 minutes.

18. A method for cleaning a photomask used in the production of integrated circuits, comprising:
    placing an assembly comprising the photomask and a pellicle mounted above the photomask in a device that comprises:
        a chamber having a platform upon which the photomask can be placed;
        at least one light source located at a top of the chamber with a downward angle of about 35° or less;
        a protective sheet located complementarily to the at least one light source;
        a vacuum outlet; and
        at least one gas inlet connected to a hydrogen gas source and a nitrogen gas source;
    pumping hydrogen gas and nitrogen gas into the chamber;
    exposing the photomask to radiation having a wavelength of about 0.1 nm to about 193 nm to decompose haze defects present on the photomask;
    removing gases from the chamber through the vacuum outlet;
    ceasing the pumping of the hydrogen gas and the exposure to radiation while maintaining pumping of the nitrogen gas;
    ceasing the pumping of the nitrogen gas; and
    removing the assembly from the chamber of the device.

19. The method of claim 18, wherein the protective sheet comprises lead, tin, antimony, or tungsten.

20. The method of claim 18, wherein the chamber has a height of about 50 cm to about 60 cm; and a length and width of about 1 meter.

* * * * *